(12) United States Patent
Oyama

(10) Patent No.: US 7,073,999 B2
(45) Date of Patent: Jul. 11, 2006

(54) RECEIVING CONTAINER BODY FOR OBJECT TO BE PROCESSED

(75) Inventor: Katsuhiko Oyama, Tokyo-To (JP)

(73) Assignee: Tokyo Electron Limited, Tokyo-To (JP)

( * ) Notice: Subject to any disclaimer, the term of this patent is extended or adjusted under 35 U.S.C. 154(b) by 33 days.

(21) Appl. No.: 10/516,511

(22) PCT Filed: May 26, 2003

(86) PCT No.: PCT/JP03/06542

§ 371 (c)(1),
(2), (4) Date: Dec. 1, 2004

(87) PCT Pub. No.: WO03/105218

PCT Pub. Date: Dec. 18, 2003

(65) Prior Publication Data

US 2005/0173358 A1 Aug. 11, 2005

(30) Foreign Application Priority Data

Jun. 6, 2002 (JP) ............................. 2002-165763

(51) Int. Cl.
*H01L 21/677* (2006.01)
*B65D 85/30* (2006.01)

(52) U.S. Cl. ...................... 414/217; 206/454; 206/711; 414/940

(58) Field of Classification Search ................ 206/449, 206/454, 710, 711, 832; 118/500; 141/1, 141/98; 211/41.18, 41.17; 414/217, 935, 414/936, 940

See application file for complete search history.

(56) References Cited

U.S. PATENT DOCUMENTS 6,105,782 A * 8/2000 Fujimori et al. ............ 206/710
6,273,261 B1 * 8/2001 Hosoi ......................... 206/711
6,315,124 B1 * 11/2001 Hirohata et al. ............ 206/454
6,446,806 B1 * 9/2002 Ohori et al. ................. 206/454
6,591,987 B1 * 7/2003 Wu et al. .................... 206/454

(Continued)

FOREIGN PATENT DOCUMENTS

JP   54-161266   12/1979

(Continued)

OTHER PUBLICATIONS

International Preliminary Examination Report (PCT/IPEA/409) (translated) issued for PCT/JP2003/06542.

(Continued)

*Primary Examiner*—Luan K. Bui
(74) *Attorney, Agent, or Firm*—Smith, Gambrell, & Russell, LLP

(57) ABSTRACT

The present invention includes: a box case having a size capable of containing an open type of cassette that can hold a plurality of first objects to be processed and capable of containing a plurality of second objects to be processed, the second objects to be processed being larger than the first objects to be processed; a supporting part provided at an inside wall surface of the box case, the supporting part being capable of supporting the second objects to be processed in a tier-like manner; an open-close lid provided at an opening part of the box case in a removable and attachable manner; and a positioning-engaging part provided at a bottom part of the box case in a removable and attachable manner. The open-close lid is capable of sealing the box case. The positioning-engaging part is capable of engaging with a positioning part provided at a lower surface of a bottom part of the cassette to position the cassette.

9 Claims, 13 Drawing Sheets

U.S. PATENT DOCUMENTS 6,779,667 B1 * 8/2004 Nigg et al. .................. 206/711
2003/0122146 A1 * 7/2003 Iijima et al. ................. 257/100

FOREIGN PATENT DOCUMENTS

| JP | 07-297257 | 11/1995 |
| JP | 08-279546 | 10/1996 |
| JP | 09-246369 | 9/1997 |
| JP | 09-306975 | 11/1997 |
| JP | 10-321696 | 12/1998 |
| JP | 11-274267 | 10/1999 |
| JP | 11-330194 | 11/1999 |
| JP | 2002-231802 | 8/2002 |

OTHER PUBLICATIONS 200 mm Cassette Adapter for 300 mm FOUPs, MicroTool web site.
AM-3004-2 300mm-200mm Cassette Adapter, MicroTool website.

* cited by examiner

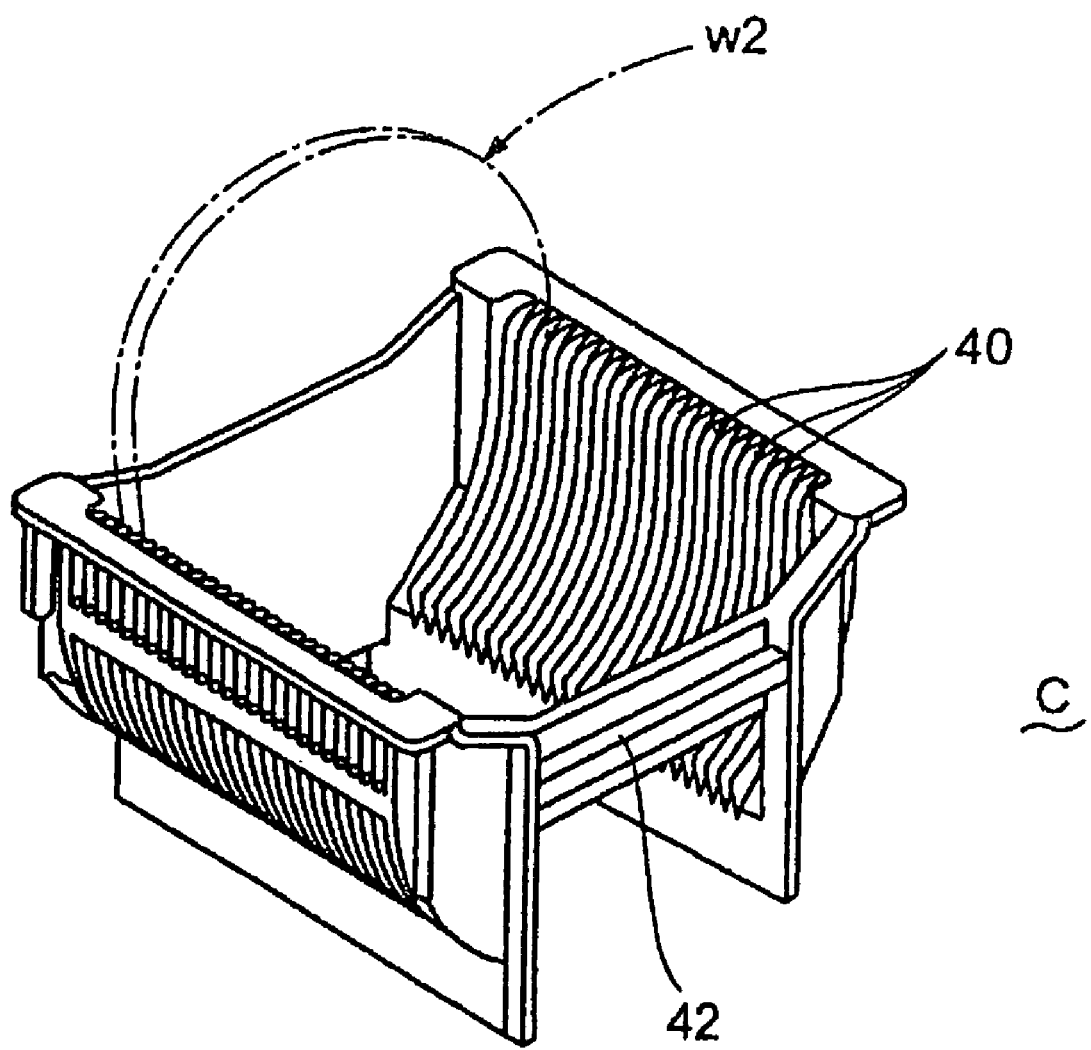
F I G. 4

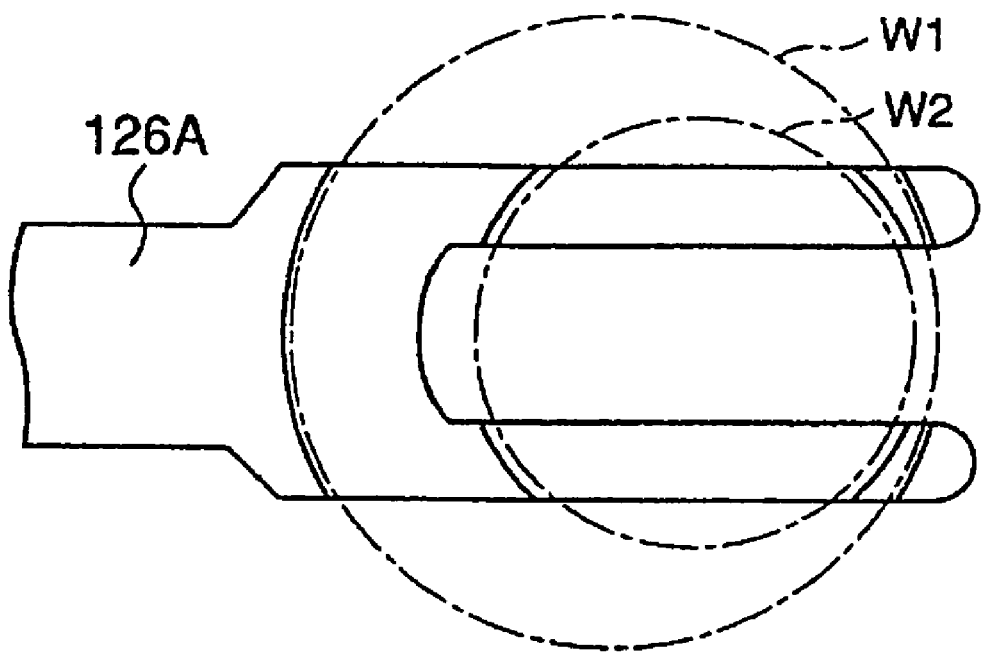
F I G. 14 (A)
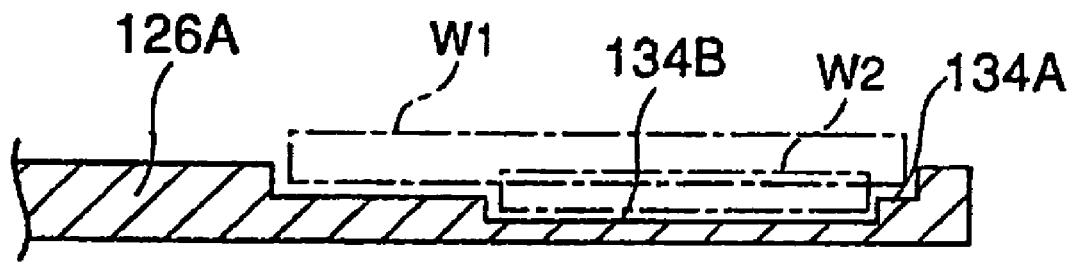
F I G. 14 (B)

RECEIVING CONTAINER BODY FOR OBJECT TO BE PROCESSED

FIELD OF THE INVENTION

This invention relates to a containing case body for an object to be processed, which can contain an object to be processed such as a semiconductor wafer in an airtight manner, and to a processing system using the containing case body.

BACKGROUND ART

In general, in order to manufacture a semiconductor integrated circuit such as an IC or an LSI, various processes including a film-forming process, an oxidation-diffusion process, an etching process or the like are repeatedly carried out to a semiconductor wafer. In order to conduct the various processes, the semiconductor wafer has to be transferred between respective processing units. In the case, as well known, in view of improvement of yield, it is necessary to prevent that particles and/or a natural oxide film may be formed and stuck on a surface of the semiconductor wafer. Then, as requests for further integration and further miniaturization are increased, for the purpose of the wafer transfer, a containing case body tends to be used, which can contain a plurality of wafers and whose inside can be sealed. As this type of containing case body, FOUP (registered trademark) is known in general (for example, JP Laid-Open publication No. 8-279546, JP Laid-Open publication No. 9-306975 and JP Laid-Open publication No. 11-274267). The containing case body has a box case wherein one side end is formed into an opening and the other side end is formed into a substantially semi-cylindrical shape. Supporting parts are provided on an inside wall surface of the box case at substantially the same pitch in a tier-like manner. A peripheral portion of a semiconductor wafer is placed on and supported by each supporting part. Thus, semiconductor wafers can be contained at substantially the same pitch in a tier-like manner. Usually, about 25 or about 13 wafers can be contained in one containing case body.

An open-close lid is attached at the opening of the box case in a removable and attachable manner. When the open-close lid is attached, the box case can maintain an airtight state to a certain extent. For example, the inside of the box case is filled with an inert-gas atmosphere such as a clean air or an $N_2$ gas. At that time, the contained wafers hardly contact with an outside atmosphere.

A locking mechanism is provided in the open-close lid. By releasing the locking mechanism, the open-close lid can be removed off from the opening.

Herein, the containing case body as described above, such as FOUP, is generally used for wafers having a lager diameter, for example wafers having a diameter of 300 mm (12 inches). The containing case body such as FOUP is not applied to wafers having a smaller diameter, for example wafers having a diameter of 200 mm (8 inches) or a diameter of 150 mm (6 inches). Conventionally, for the wafers having a smaller diameter, an open type of cassette, which doesn't have a sealed structure, is used. The wafers are contained in the open type of cassette in a tier-like manner while the wafers are exposed to an atmospheric air.

Under that situation, based on the requests for further integration and further miniaturization of an integrated circuit, for the purpose of preventing particle problems, it has been requested that the wafers having a smaller diameter are transferred by using a hermetically-closed type of containing case body.

In the case, it can be thought that different sizes of containing case bodies are used for respective wafer sizes. However, this may increase facility cost. Thus, in order to avoid the problem, an assistant jig has been proposed, which makes it possible to fix an open type of cassette for wafers having a smaller diameter to the inside of a containing case body for wafers having a larger diameter.

As the assistant jig, for example, a cassette adaptor AM-3004 (registered trademark) made by Micro Tool co. is known. The assistant jig has a base 2 of a semi-elliptic shape, as shown in FIG. 15. Four columns 4 stand up from peripheral portions of the base 2. Upper ends of the four columns 4 support a ceiling plate 6 of a semi-circular-arc shape, whose diameter is substantially the same as that of a 300 mm wafer. At substantially a center portion of the base 2, positioning protrusions 8 are provided for positioning a cassette C for 200 mm wafers as wafers having a smaller diameter. The cassette C is adapted to be positioned and fixed by the positioning protrusions 8.

Wheels 10 to be held having elasticity, for example made of poly-carbonate resin, are provided at peripheral portions of the base 2 and the ceiling plate 6. The wheels 10 to be held are adapted to be fitted in supporting parts of a containing case body for 300 mm wafers (not shown) which are originally provided for supporting peripheral portions of 300 mm wafers. Thus, the whole assistant jig is adapted to be fixed in the containing case body for 300 mm wafers. That is, when the 300 mm wafers are to be contained, the containing case body for 300 mm wafers is used in a state wherein the assistant jig is removed off. Then, when the 200 mm wafers are to be contained, the containing case body for 300 mm wafers is used in a state wherein the assistant jig is fitted therein, so that the cassette C is fixed and used in the assistant jig. Thus, two kinds of wafers having different sizes can be selectively contained in a hermetically-sealed manner by means of one kind of containing case body.

However, the above assistant jig has the following problems. That is, the center of the 200 mm wafers when the 200 mm wafers are contained with the assistant jig and the center of the 300 mm wafers when the 300 mm wafers are contained without the assistant jig are located at substantially the same position in a horizontal plane. That is, when the 200 mm wafers are contained, a larger space is generated between the 200 mm wafers and the open-close lid. As a result, the 200 mm wafers may considerably slide in the cassette C.

In addition, when the wheels 10 to be held are fitted into the supporting parts for the 300 mm wafers, the supporting parts may be damaged. If cracks or the like are formed in the supporting parts, when the supporting parts support the 300 mm wafers, the 300 mm wafers may be damaged. Furthermore, if cracks or the like are formed in the supporting parts, the thin wheels 10 to be held may be broken and disenabled.

SUMMARY OF THE INVENTION

This invention is developed by focusing the aforementioned problems in order to resolve them effectively. The object of this invention is to provide a containing case body for an object to be processed and a processing system using the containing case body, wherein larger and smaller objects to be processed having different diameters can be selectively contained, positions of the objects to be processed are not shifted while the objects to be processed are contained, and a supporting part for the larger object to be processed is not damaged.

This invention is a containing case body for an object to be processed comprising: a box case having a size capable of containing an open type of cassette that can hold a plurality of first objects to be processed and capable of containing a plurality of second objects to be processed, the second objects to be processed being larger than the first objects to be processed; a supporting part provided at an inside wall surface of the box case, the supporting part being capable of supporting the second objects to be processed in a tier-like manner; an open-close lid provided at an opening part of the box case in a removable and attachable manner; and a positioning-engaging part provided at a bottom part of the box case in a removable and attachable manner; wherein the open-close lid is capable of sealing the box case; and the positioning-engaging part is capable of engaging with a positioning part provided at a lower surface of a bottom part of the cassette to position the cassette.

According to the invention, since the positioning-engaging part for positioning the cassette is provided at a bottom part of the box case in a removable and attachable manner, when larger objects to be processed, for example of 300 mm diameter, are contained, peripheral portions of the larger objects to be processed can be supported by the supporting part and the larger objects to be processed are contained in a tier-like manner in a state wherein the positioning-engaging part is removed off. On the other hand, when smaller objects to be processed, for example of 200 mm diameter, are contained, the open type of cassette is positioned and fixed in the box case by means of the positioning-engaging part in a state wherein the positioning-engaging part is attached, and the smaller objects to be processed can be contained in the cassette. In addition, it can be prevented that the supporting part for the larger objects to be processed is damaged.

In particular, it is preferable that a position of peripheral edges of the first objects to be processed on a side of the opening part when the cassette that holds the first objects to be processed is contained in the box case and a position of peripheral edges of the second objects to be processed on the side of the opening part when the second objects to be processed are contained in the box case substantially coincide with each other.

In addition, it is preferable that a first pop-out-preventing member is provided on an inside of the open-close lid for preventing that the first objects to be processed pop out from the cassette when the cassette that holds the first objects to be processed is contained in the box case.

In the case, it is preferable that the first pop-out-preventing member is removable from and attachable to the open-close lid.

Alternatively, it is preferable that a second pop-out-preventing member is provided on an inside of the open-close lid for preventing that the second objects to be processed pop out from the box case when the second objects to be processed are contained in the box case.

In the case too, it is preferable that the second pop-out-preventing member is removable from and attachable to the open-close lid.

If a cassette base platform is contained at a bottom part of the box case in a removable and attachable manner, it is preferable that the positioning-engaging part is provided on an upper surface of the cassette base platform.

In the case, preferably, a platform fixing jig is provided at a peripheral portion of the cassette base platform, the platform fixing jig is capable of protruding from and withdrawing into the peripheral portion, and the cassette base platform is adapted to be fixed in the box case when the platform fixing jig is pressed to an inside wall of the box case.

For example, the platform fixing jig may be provided at each of three peripheral portions of the cassette base platform.

Alternatively, the present invention is a containing case body for an object to be processed comprising: a box case having a size capable of containing an open type of cassette that can hold a plurality of objects to be processed; an open-close lid provided at an opening part of the box case in a removable and attachable manner; and a positioning-engaging part provided at a bottom part of the box case; wherein the open-close lid is capable of sealing the box case, and the positioning-engaging part is capable of engaging with a positioning part provided at a lower surface of a bottom part of the cassette to position the cassette.

In the case, it is preferable that a pop-out-preventing member is provided on an inside of the open-close lid for preventing that the objects to be processed pop out from the cassette when the cassette that holds the objects to be processed is contained in the box case.

Alternatively, the present invention is a processing system comprising: a case-body conveying area in which a containing case body according to any of claims 1 to 11 can be conveyed; an object-to-be-processed conveying area that is filled with an inert-gas atmosphere or a clean-gas atmosphere; a division wall that divides the case-body conveying area and the object-to-be-processed conveying area; an opening formed at the division wall; a stage on which the containing case body is placed in such a manner that the opening part of the containing case body faces the opening on a side of the case-body conveying area; a load port provided in the case-body conveying area, capable of communicating with an outside area; a stocker provided in the case-body conveying area, by which the containing case body can be temporarily stocked; a case-body conveying mechanism that conveys the containing case body between the load port, the stocker and the stage; an opening-closing mechanism that opens and closes the open-close lid of the containing case body when the containing case body is placed on the stage; an object-to-be-processed boat provided in the object-to-be-processed conveying area, corresponding to a size of an object to be processed contained in the containing case body; a processing container provided in the object-to-be-processed conveying area, capable of conducting a predetermined thermal process to the object to be processed; a boat elevating mechanism that moves up and down the object-to-be-processed boat to convey the object-to-be-processed boat into and out from the processing container; and an object-to-be-processed conveying mechanism that conveys the object to be processed between the object-to-be-processed boat and the containing case body placed on the stage.

BRIEF DESCRIPTION OF THE DRAWINGS

FIG. 4 is a perspective view showing a cassette containing smaller objects to be processed;

FIG. 14 is a view showing an example of object-to-be-processed conveying mechanism used in the processing system.

DESCRIPTION OF THE PREFERRED EMBODIMENT

Hereinafter, an embodiment of a containing case body for an object to be processed according to the present invention and a processing system using the containing case body is explained based on attached drawings.

Figure 1:
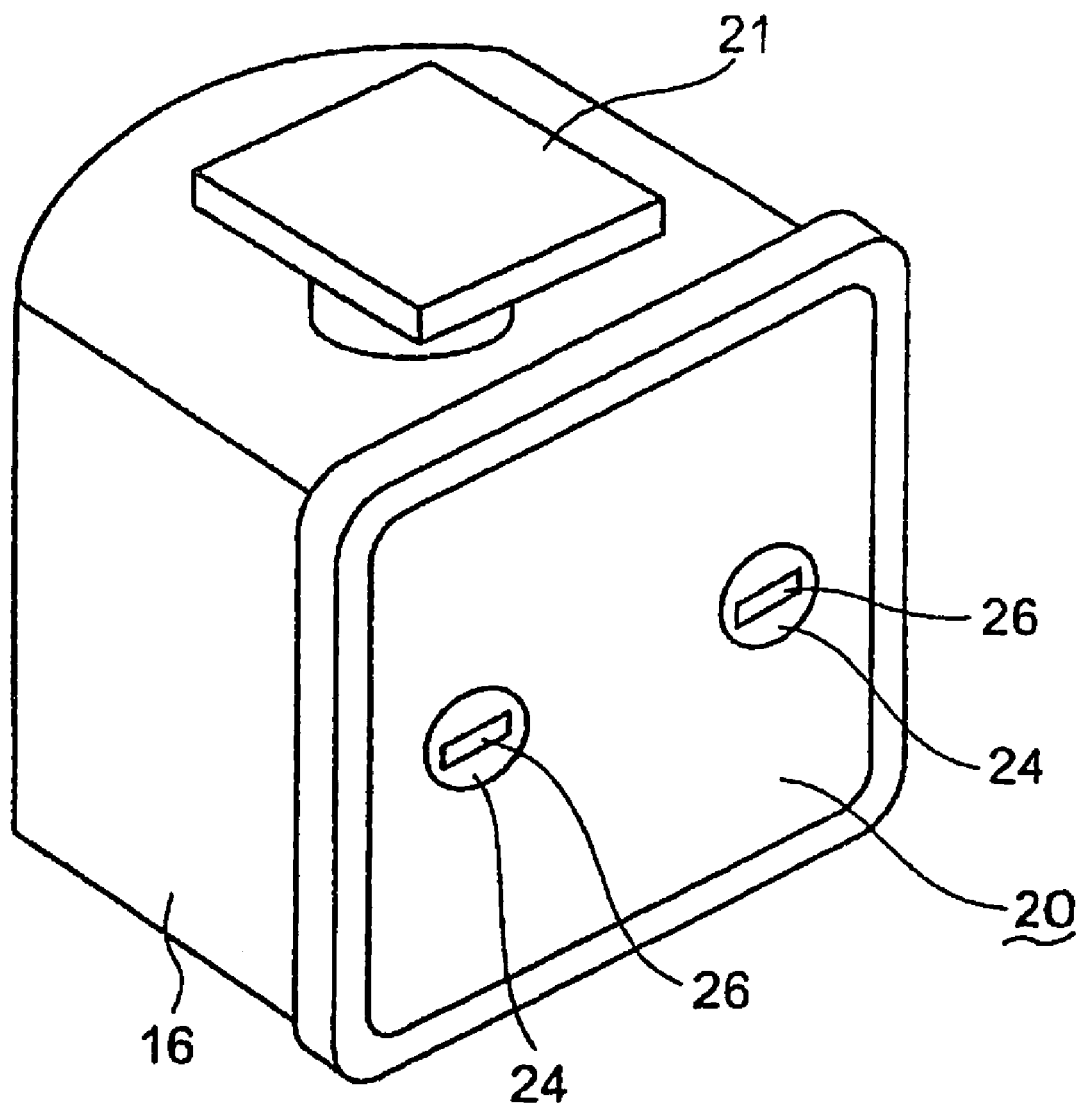
FIG. 1 is a perspective view showing a containing case body for an object to be processed according to an embodiment of the present invention.
Figure 2:
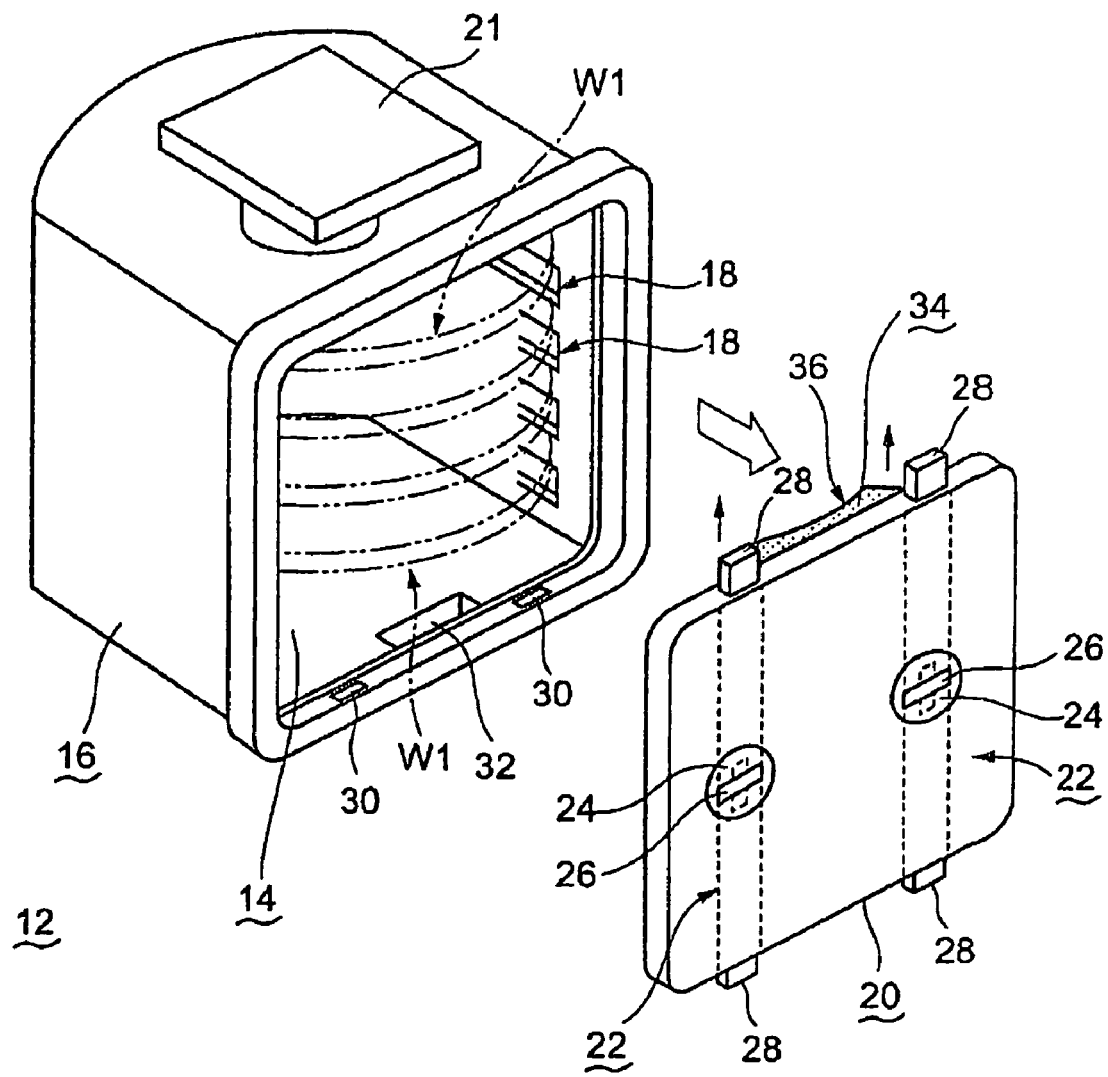
FIG. 2 is a perspective view showing a state of the containing case body wherein larger objects to be processed are contained and an open-close lid is removed.
Figure 3:
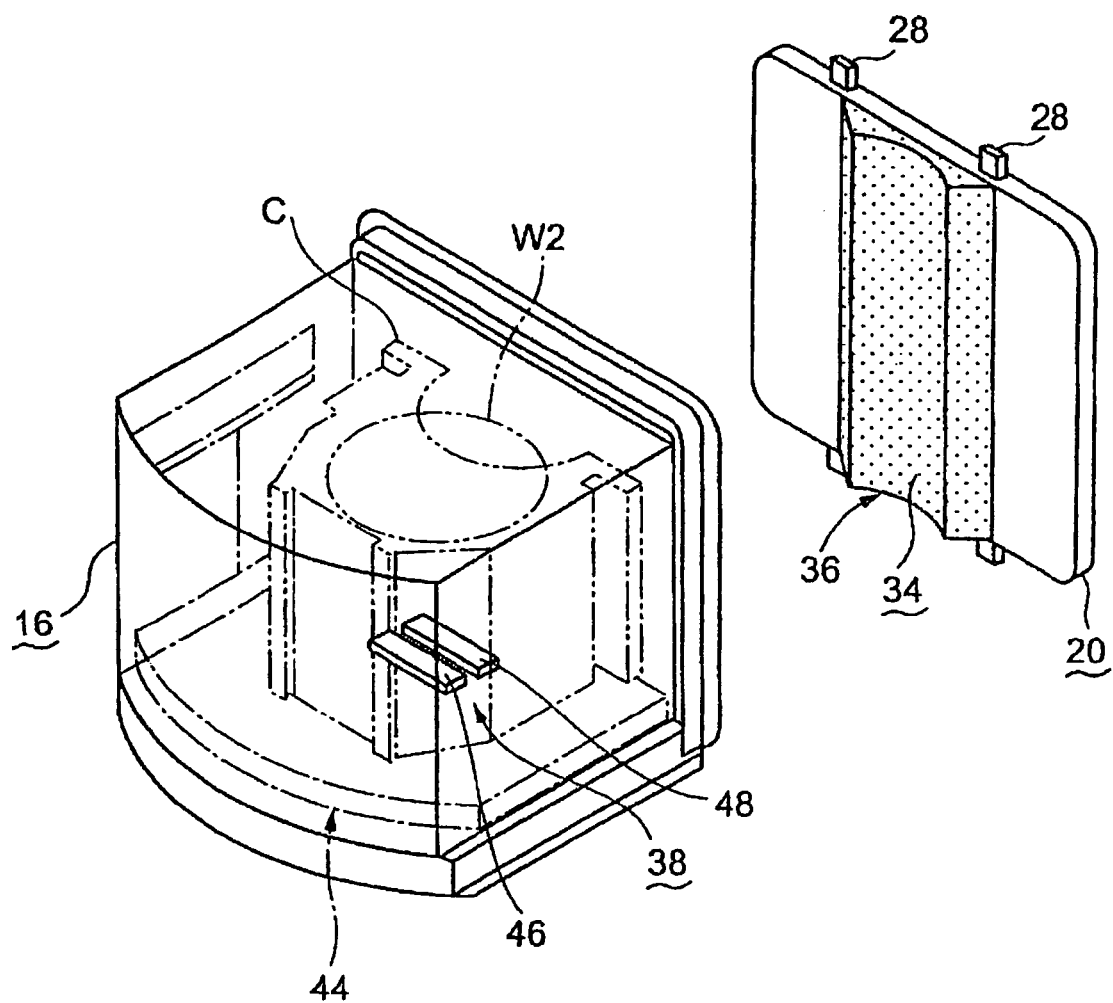
FIG. 3 is a perspective view showing a state of the containing case body wherein a cassette containing smaller objects to be processed is contained and the open-close lid is removed.
Figure 5:
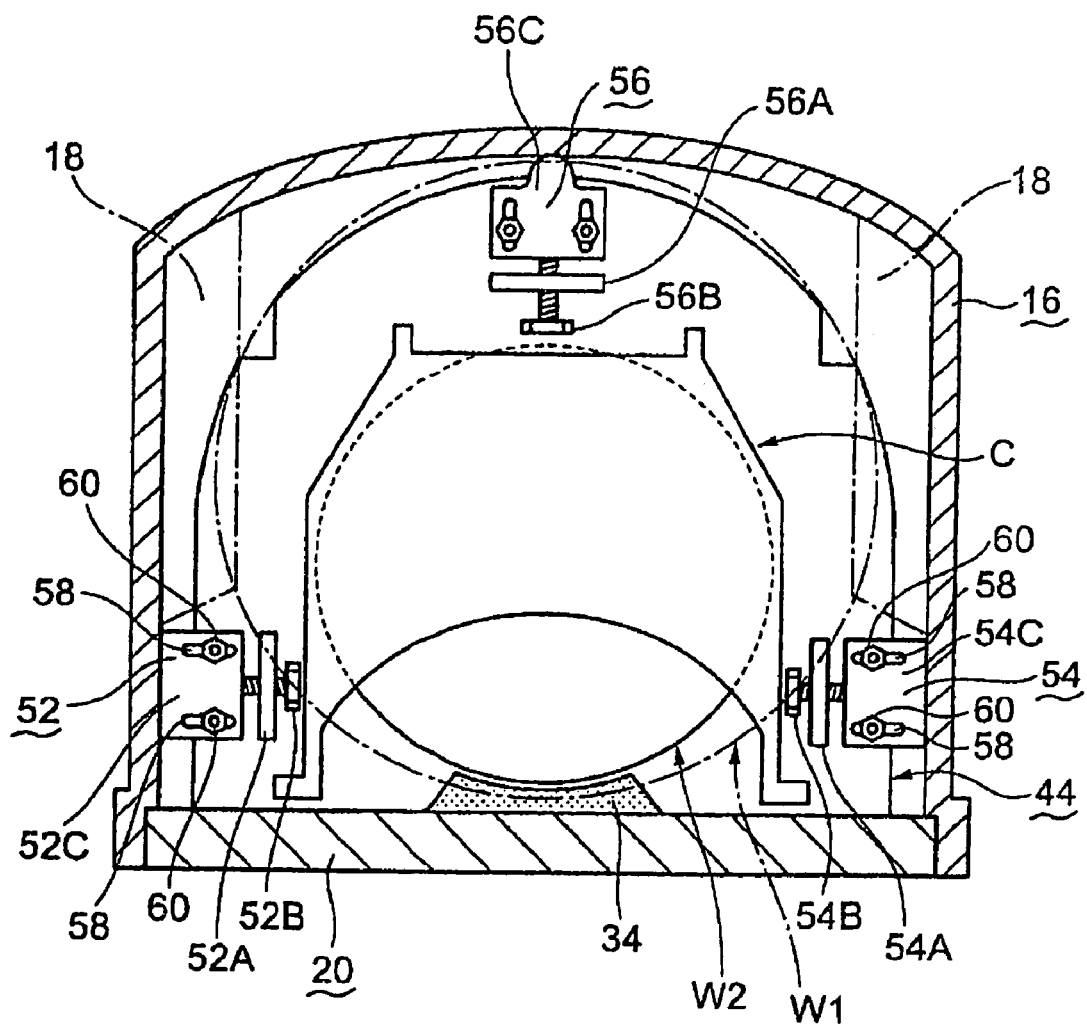
FIG. 5 is a transversal sectional view showing the containing case body in a state wherein the cassette is contained therein.
Figure 6:
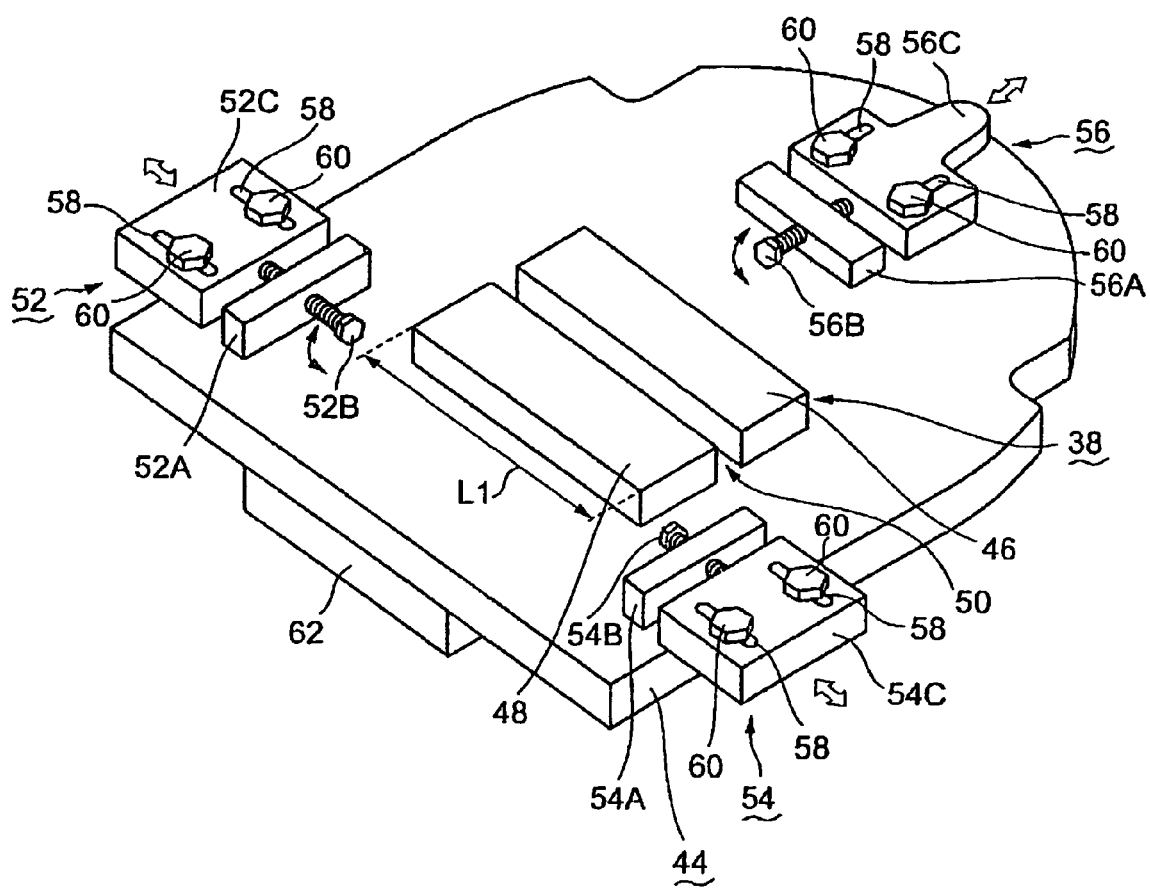
FIG. 6 is a perspective view showing a cassette base platform provided with a positioning-engaging part.
Figure 7:
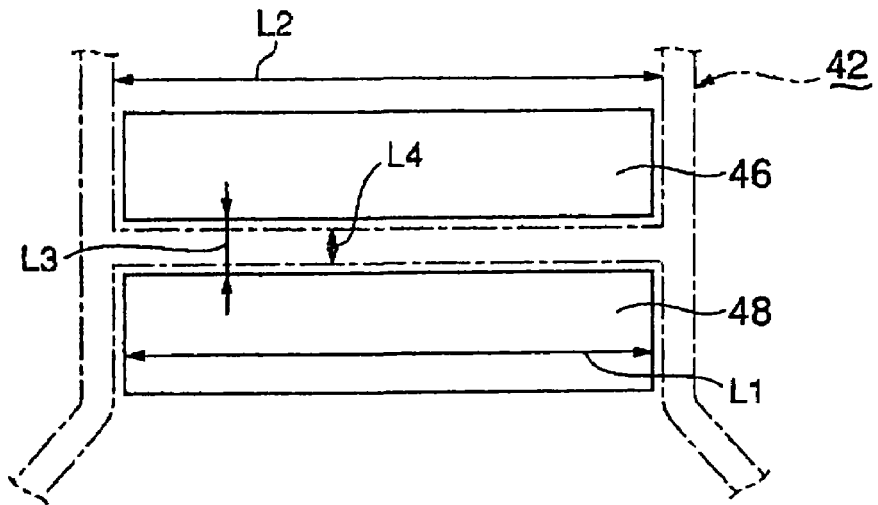
FIG. 7 is a view showing a state wherein a positioning member is fitted in the positioning-engaging part.

FIG. 1 is a perspective view showing a containing case body for an object to be processed according to the embodiment. FIG. 2 is a perspective view showing a state of the containing case body wherein larger objects to be processed are contained and an open-close lid is removed. FIG. 3 is a perspective view showing a state of the containing case body wherein a cassette containing smaller objects to be processed is contained and the open-close lid is removed. FIG. 4 is a perspective view showing a cassette containing smaller objects to be processed. FIG. 5 is a transversal sectional view showing the containing case body in a state wherein the cassette is contained therein. FIG. 6 is a perspective view showing a cassette base platform provided with a positioning-engaging part. FIG. 7 is a view showing a state wherein a positioning member is fitted in the positioning-engaging part.

As shown in FIGS. 1 and 2, the containing case body 12 has a box case 16 wherein one side end thereof is formed as an opening part 14 and the other side end thereof is formed into a substantially semi-elliptic-pole shape. Supporting parts 18 are provided on an inside wall surface of the box case 16 at substantially the same pitch in a tier-like manner. For example, each supporting part 18 is formed in a shelf-like or groove-like shape. A peripheral portion of a semiconductor wafer W1 of for example 300 mm diameter as a larger object to be processed is placed on and supported by each supporting part 18. Thus, larger semiconductor wafers W1 can be contained at substantially the same pitch in a tier-like manner. A knob 21 is provided at a ceiling part of the box case 16. The knob 21 is grasped when the whole box case 16 is held. Usually, about 25 or about 13 larger wafers W1 can be contained in one box case 16.

A tetragonal hollow board-like open-close lid 20 is attached at the opening part 14 of the box case 16 in a removable and attachable manner, so that the inside of the box case 16 is maintained at an airtight state. The inside of the box case 16 is adapted to be filled with an atmosphere of an inert gas such as an $N_2$ gas or a clean air. At that time, the contained wafers W1 hardly contact with an outside atmosphere.

Two locking mechanisms 22 are provided in the open-close lid 20. By releasing the locking mechanisms 22, the open-close lid 20 can be removed off from the opening part 14. Specifically, each locking mechanism 22 has a disk-like locking plate 24, which is rotatably mounted at a substantially center of the open-close lid 20 in a vertical direction. A longitudinal concave keyhole 26 is formed in the locking plate 24. Protrusion pins 28 are respectively provided in an upward direction and in a downward direction with respect to the locking plate 24, via a crank mechanism (not shown) that converts an arc movement into a linear movement. Thus, when the locking plate 24 is rotated reciprocally by substantially 90 degrees, the upper and lower protrusion pins 28 respectively move in the upward and downward directions.

At a locked state, as shown in FIG. 2, tip ends of the protrusion pins 28 are adapted to be inserted in pinholes 30 at an upper edge portion and a lower edge portion defining the opening part 14 of the box case 6, and to engage with them (only pinholes 30 at the lower edge portion are shown in FIG. 2). Thus, at the locked state, the open-close lid 20 is adapted not to be removed off from the opening part 14. In addition, a groove portion 32 is formed at an inside of the opening part 14 in the vicinity of the lower edge portion.

Then, a pop-out-preventing member 34 is provided on an inside surface of the open-close lid 20, along a vertical direction thereof, for preventing the wafers contained in the box case 16 from popping out (see FIG. 3). The pop-out-preventing member 34 is a board-like member made of a material such as PEEK (poly-ether-ether-ketone) or the like, which has a great durability against halogen, halogen compounds, acid, alkali, and so on. In addition, a contact surface 36 of the pop-out-preventing member 34 to the wafers is shaped into a curve surface having substantially the same curvature as that of the larger wafers W1.

Herein, the pop-out-preventing member 34 may be made of a synthetic rubber or the like, that is, may have elasticity to some extent. In addition, arc grooves for containing peripheral edge portions of the wafers may be formed at the pop-out-preventing member 34.

As shown in FIGS. 3 to 6, a positioning-engaging part 38 for positioning a cassette C is provided at a bottom part of the box case 16 in a removable and attachable manner. Specifically, as first, as shown in FIGS. 3 and 4, the cassette C can contain smaller objects to be processed, such as semiconductor wafers W2 having a diameter of 200 mm (8 inches), in a tier-like manner. In FIG. 4, the cassette C is shown in a state wherein a back surface of the cassette C contacts with a floor. The cassette C has a fully opened box shape. The cassette C is made of a material superior in chemical resistance and heat resistance, such as Teflon (registered trademark).

Supporting shelves 40 are arranged on right and left inside walls at the same pitch in a tier-like manner. A peripheral edge portion of a smaller wafer W2 is placed on and supported by each supporting shelf 40. In the case, for example about 25 smaller wafers W2 can be supported by the one cassette C. The knob 21 is omitted in FIG. 3.

Then, as shown in FIG. 4, a positioning member 42 protruding in a substantially H-like shape is formed at a lower surface of the bottom part of the cassette C. The protruding positioning member 42 also has a function as a reinforcing member for preventing deformation of the cassette C itself.

As shown in FIGS. 3, 5 and 6, in detail, the positioning-engaging part 38 for positioning the cassette C is fixed on a cassette base platform 44, which is mounted at the bottom part of the box case 16 in a removable and attachable manner. The positioning-engaging part 38 consists of two board members 46 and 48, which are arranged away from each other by a predetermined gap. The gap between the board members 46 and 48 forms a groove 50 for fitting. As shown in FIG. 7, the length L of the board members 46 and 48 is set a little smaller than the width L2 of the positioning member 42 of the H-like shape on the lower surface at the bottom part of the cassette C. On the other hand, the width L3 of the groove 50 is set a little larger than the thickness L4 of the positioning member 42. When the positioning member 42 is fitted into the positioning-engaging part 38 as shown in FIG. 7, the cassette C is positioned and installed on the cassette base platform 44. The two board members 46 and 48 may be formed by a single board member and the groove 50 may be formed at a substantially center thereof. In addition, the board members 46 and 48 may be attached to the cassette base platform 44 in a position adjustable manner by means of a screw or the like.

The cassette base platform 44 has a size a little smaller than that of the bottom part of the box case 16, and is formed into a substantially semi-elliptic shape by PC (poly-carbonate) or the like. Three platform-fixing jigs 52, 54 and 56 are mounted in total at peripheral portions of the cassette base platform 44, that is, at both end portions on the side of the opening part 14 and at an inside position away from the opening part 14 (see FIG. 5).

Specifically, each platform-fixing jig 52, 54 or 56 has a fixed frame 52A, 54A or 56A that is fixed to the cassette base platform 44. Each fixed frame 52A, 54A or 56A is provided with an adjustable screw 52B, 54B or 56B, which can protrude from and withdraw into the fixed frame in a horizontal direction. A pushing member 52C, 54C or 56C is attached to each adjustable screw 52B, 54B or 56B. Each pushing member 52C, 54C or 56C can move outside from the cassette base platform 44 by rotating each adjustable screw 52B, 54B or 56B. The cassette base platform 44 is fixed in the box case 16 by pressing the pushing members 52C, 54C and 56C toward the inside wall of the box case 16.

Two guide long holes 58 are formed at each pushing member 52C, 54C or 56C. A fixing screw 60 is inserted into each guide long hole 58. A lower end of the fixing screw 60 can be screwed into the cassette base platform 44. Thus, under a state wherein the fixing screws 60 are loose, the respective pushing members 52C, 54C and 56C can move in the respective directions of the guide long holes 58. In addition, by fastening the fixing screws 60 under a state wherein the respective pushing members 52C, 54C and 56C are pressed toward the inside wall of the box case 16, the cassette base platform 44 can be strongly and surely fixed in the box case 16. In the case, a tip portion of the pushing member 56C located at the inside position is formed into a curve surface corresponding to a curve wall surface of the box case 16.

In addition, as shown in FIG. 6, an engagement protrusion 62 that protrudes downward is provided on a lower surface of the cassette base platform 44 on a tip-end side (on the side of the opening part 14). The engagement protrusion 62 is adapted to be fitted in the groove 32 (see FIG. 2) provided at the bottom part of the box case 16.

Herein, an installation position of the positioning-engaging part 38 is set at such a position that tip-end side portions of the smaller wafers W2 contained in the cassette C contained in the box case 16 substantially come in contact with the pop-out-preventing member 34.

Next, a case is explained wherein the larger wafers W1 and the smaller wafers W2 are selectively contained in the containing case body 12 formed as the above.

At first, when the larger wafers W1 having a diameter of for example 300 mm (12 inches) are contained in the containing case body 12, as shown in FIG. 2, the cassette base platform 44 and the like are not installed in the box case 16. Under the state, peripheral portions of the larger wafers W1 are placed on the respective supporting parts 18 provided on the inside wall of the box case 16. Thus, the wafers W1 are supported in a tier-like manner.

Then, the opening part 14 of the box case 16 is closed by the open-close lid 20. The open-close lid 20 is locked. At that time, the pop-out-preventing member 34 provided at the open-close lid 20 substantially comes into contact with edge portions of the larger wafers W1. Thus, when the containing case body 12 is conveyed, it can be prevented that the larger wafers W1 move or shift in the containing case body 12.

Next, a case is explained wherein the smaller wafers W2 having a diameter of for example 200 mm (8 inches) are contained in the containing case body 12. In the case, at first, the cassette base platform 44 as shown in FIG. 6 is installed at the bottom part of the box case 16 that is in a vacant state. When the cassette base platform 44 is installed, the cassette base platform 44 is contained at the bottom part in the box case 16. At that time, the engagement protrusion 62 as shown in FIG. 6 is engaged with the groove 32 of the box case bottom (see FIG. 2). Then, the respective adjustable screws 52B, 54B and 56B of the platform-fixing jigs 52, 54 and 56 are rotated in such a manner that the respective pushing members 52C, 54C and 56C move outward.

The respective tip ends of the pushing members 52C, 54C and 56C of the platform-fixing jigs 52, 54 and 56 come in contact with the inside surface of the box case 16, and are pressed toward the same strongly. Under that state, the respective fixing screws 60 are fastened so that the respective pushing members 52C, 54C and 56C are fixed. Thus, the cassette base platform 44 is fixed at the bottom part in the box case 16. When the cassette base platform 44 is removed off, an operation reverse to the above may be carried out.

After the cassette base platform 44 is installed and fixed as described above, the open type of cassette C that can contain the wafers W2 having a diameter of 200 mm is installed on the cassette base platform 44. In the case, the convex positioning member 42 (see FIG. 4) provided at the bottom part of the cassette C is positioned to and fitted in the positioning-engagement part 38 (see FIG. 6) on the cassette base platform 44 (see FIG. 7).

Thus, the cassette C is installed at an appropriate position on the cassette base platform 44. In the cassette C, the smaller wafers W2 having a diameter of 200 mm are placed in a tier-like manner, for example. Thus, the smaller wafers W2 are contained and held in the containing case body 12.

In the case too, the opening part 14 of the box case 16 is closed by the open-close lid 20. At that time, as shown in FIG. 5, the pop-out-preventing member 34 provided at the open-close lid 20 substantially comes into contact with edge portions of the wafers W2 in the cassette C. Thus, when the containing case body 12 is conveyed, it can be prevented that the wafers W2 move or shift in the containing case body 12 to pop out from the same.

As described above, since the cassette base platform 44 and the cassette C are installed in and removed off from the box case 16, the larger wafers (the wafers W1 having a diameter of for example 300 mm) and the smaller wafers (the wafers W2 having a diameter of for example 200 mm) can be selectively contained in the containing base body 12.

In addition, the cassette base platform 44 at which the cassette C is installed can be attached to or removed off only by handling the platform-fixing jigs 52, 54 and 56. Thus, the attaching or removing operation may be carried out easily.

In addition, when the cassette base platform 44 is installed in the box case 16, the supporting parts 18 (see FIG. 2) for supporting the larger wafers W1 are not used. Thus, the supporting parts 18 may not be damaged.

Figure 8:
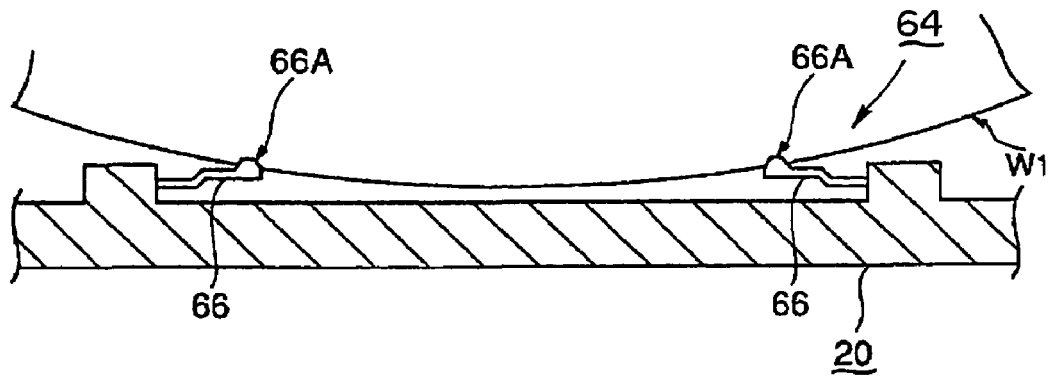
FIG. 8 is a view showing a pop-out-preventing member for a larger wafer.
Figure 9:
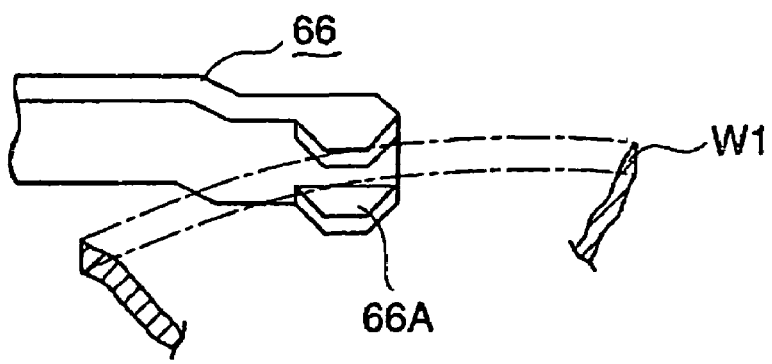
FIG. 9 is a perspective view showing a portion of the pop-out-preventing member shown in FIG. 8.
Figure 10:
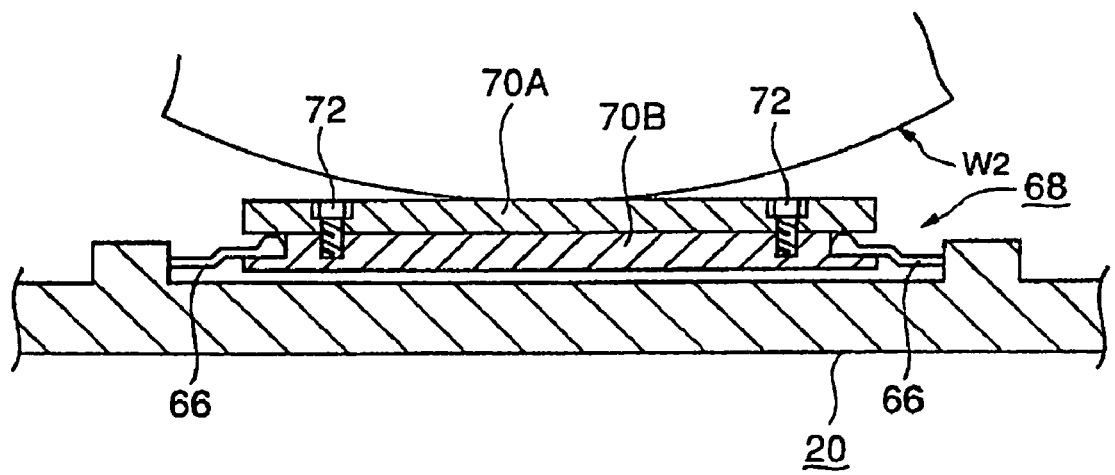
FIG. 10 is a view showing a pop-out-preventing member for a smaller wafer.

Herein, in the above embodiment, the pop-out-preventing member 34 consists of the board made of PEEK having the curve contact surface to the wafers, but is not limited thereto. For example, a structure as shown in FIGS. 8 to 10 can be adopted. FIG. 8 is a view showing a pop-out-preventing member for a larger wafer. FIG. 9 is a perspective view showing a portion of the pop-out-preventing member shown in FIG. 8. FIG. 10 is a view showing a pop-out-preventing member for a smaller wafer.

The pop-out-preventing member 64 for a larger wafer W1 as shown in FIGS. 8 and 9 has a pair of elastic supporting arms 66, which can come in contact with peripheral edge portions of the wafer W1. The pair of elastic supporting arms 66 may be made of PEEK (poly-ether-ether-ketone), for example. Each arm 66 can be bent, that is, has elasticity to some extent. The pair of elastic supporting arms 66 extends in a horizontal direction. The number of the pairs corresponds to the number of wafers W1 to be contained and the pairs are arranged at a predetermined pitch in a vertical (height) direction of the open-close lid 20. A containing concave portion 66A, which can pinch the upper and lower surfaces of the wafer W1 to hold the same, is formed at the tip end of each elastic supporting arm 66. Thus, the peripheral portions of the wafers W1 are surely held. That is, the elastic supporting arms 66 can prevent the larger wafers W1 from popping out.

The pop-out-preventing member 68 for a smaller wafer W2 as shown in FIG. 10 has two thin elastic plate members 70A and 70B made of PEEK, for example. Under a state wherein peripheral portions of the two elastic plate members 70A and 70B pinch the above elastic supporting arm 66, the two elastic plate members 70A and 70B are fixed to each other by means of screws 72. As a result, the plate members 70A and 70B can prevent the smaller wafer W2 from popping out. In the case, instead of the elastic supporting arm 66, another member may be provided.

In addition, in the above embodiment, the wafer having a diameter of 300 mm (12 inches) is used as a larger wafer W1, the wafer having a diameter of 200 mm (8 inches) is used as a smaller wafer W2. However, this invention is not limited thereto. A wafer having a diameter of for example 150 mm (6 inches) may be used as a smaller wafer W2.

In addition, in the above embodiment, the positioning-engagement part 38 is provided on the cassette base platform 44. However, this invention is not limited thereto. The positioning-engagement part 38 may be directly attached to and removed off from a bottom part of the box case 16, without using the cassette base platform 44. For example, the positioning-engagement part 38 may be fixed to a bottom part of the box case 16 by means of screws or the like.

In addition, the containing case body 12 in the above embodiment can selectively contain the wafers W1 having a diameter of 300 mm and the wafers W2 having a diameter of 200 mm. However, this invention is not limited thereto.

Figure 11:
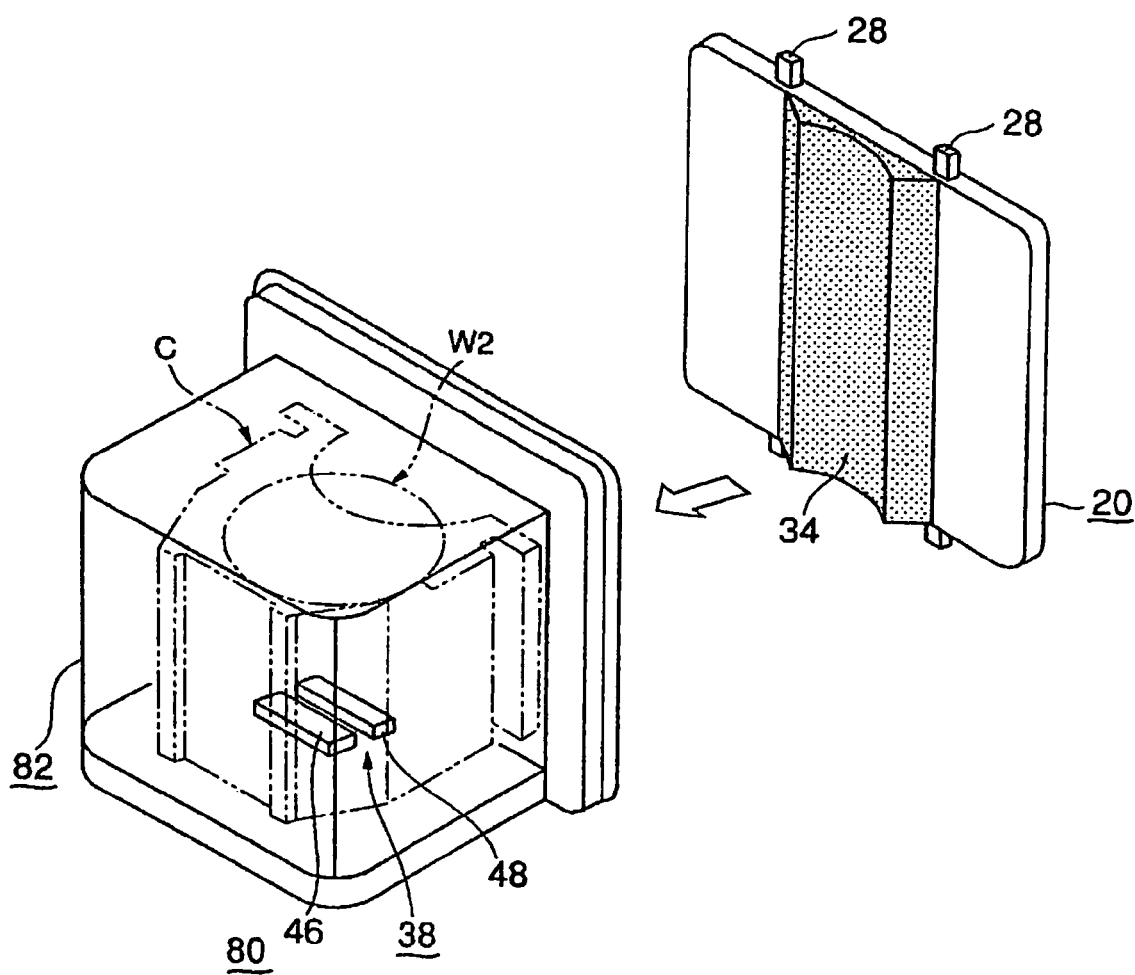
FIG. 11 is a perspective view showing a modified embodiment of a containing case body of the present invention.

FIG. 11 is a perspective view showing a containing case body 80 that can contain only smaller wafers W2 having a diameter of for example 200 mm together with the cassette C.

In the containing case body 80, it is sufficient that a box case 82 has a size capable of containing the cassette C. Thus, the box case 82 is formed into a little smaller shape than the box case 16 as shown in FIGS. 2 and 3. In addition, of course, no supporting part for supporting a larger wafer W1 is provided at the box case 16.

In addition, the positioning-engagement part 38 doesn't have to be attachable and detachable. Thus, the cassette base platform 44 (see FIG. 3) is not provided. That is, the positioning-engagement part 38 is directly fixed to a bottom part of the box case 82. Then, as described above, the cassette C is positioned and fixed by using the positioning-engagement part 38.

On the other hand, the open-close lid 20 that closes an opening part of the box case 82 has the same dimensions as that shown in FIGS. 2 and 3. Thus, an outside mechanism for releasing the locking mechanism 22 (see FIG. 2) of the open-close lid 20 of the containing case body 80 may be the same as an outside mechanism for releasing the locking mechanism 22 of the containing case body 12 shown in FIGS. 2 and 3. In FIG. 11, the knob is omitted.

As described above, according to the containing case body 80, the smaller wafers W2 contained in the open type of cassette C can be contained in a hermetically sealed state.

Next, an example of processing system for conducting a predetermined thermal process to the wafers W1 or W2 contained in the above containing case body 12 or 80 is explained.

Figure 12:
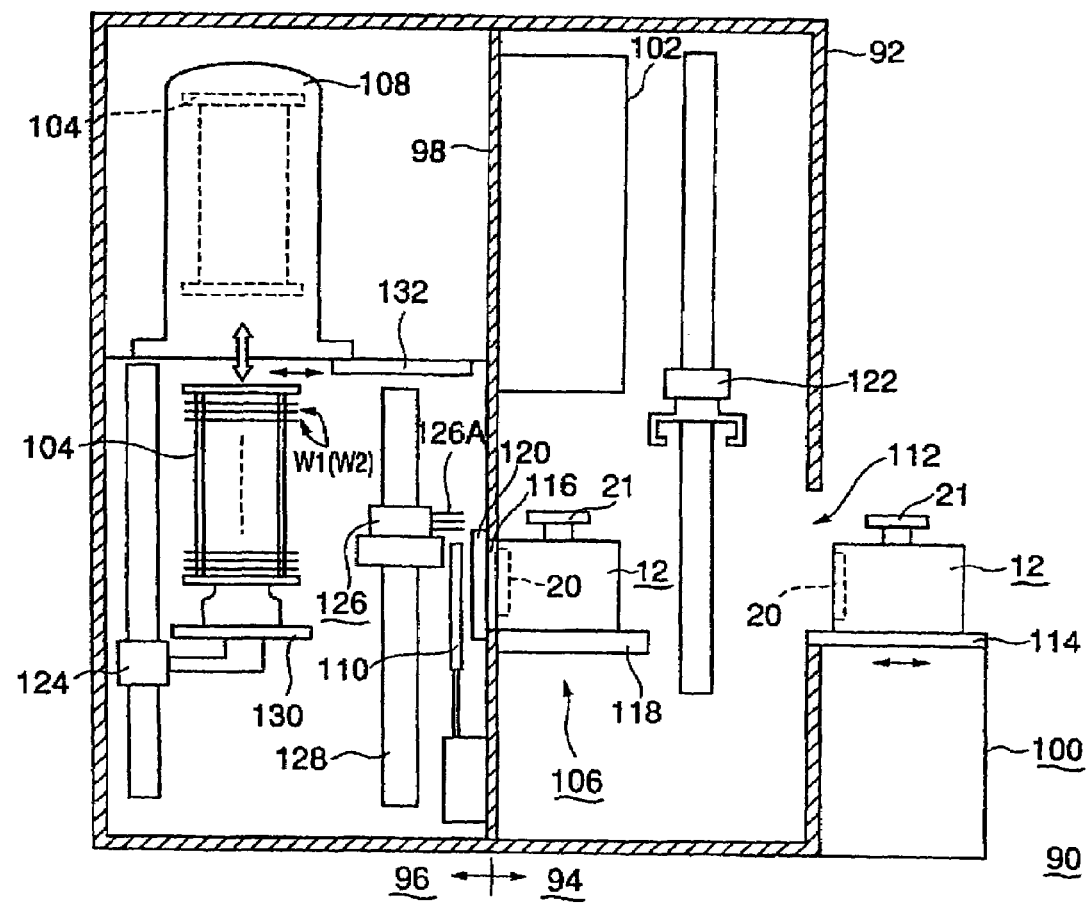
FIG. 12 is a schematic structural view showing an example of processing system of the present invention.
Figure 13:
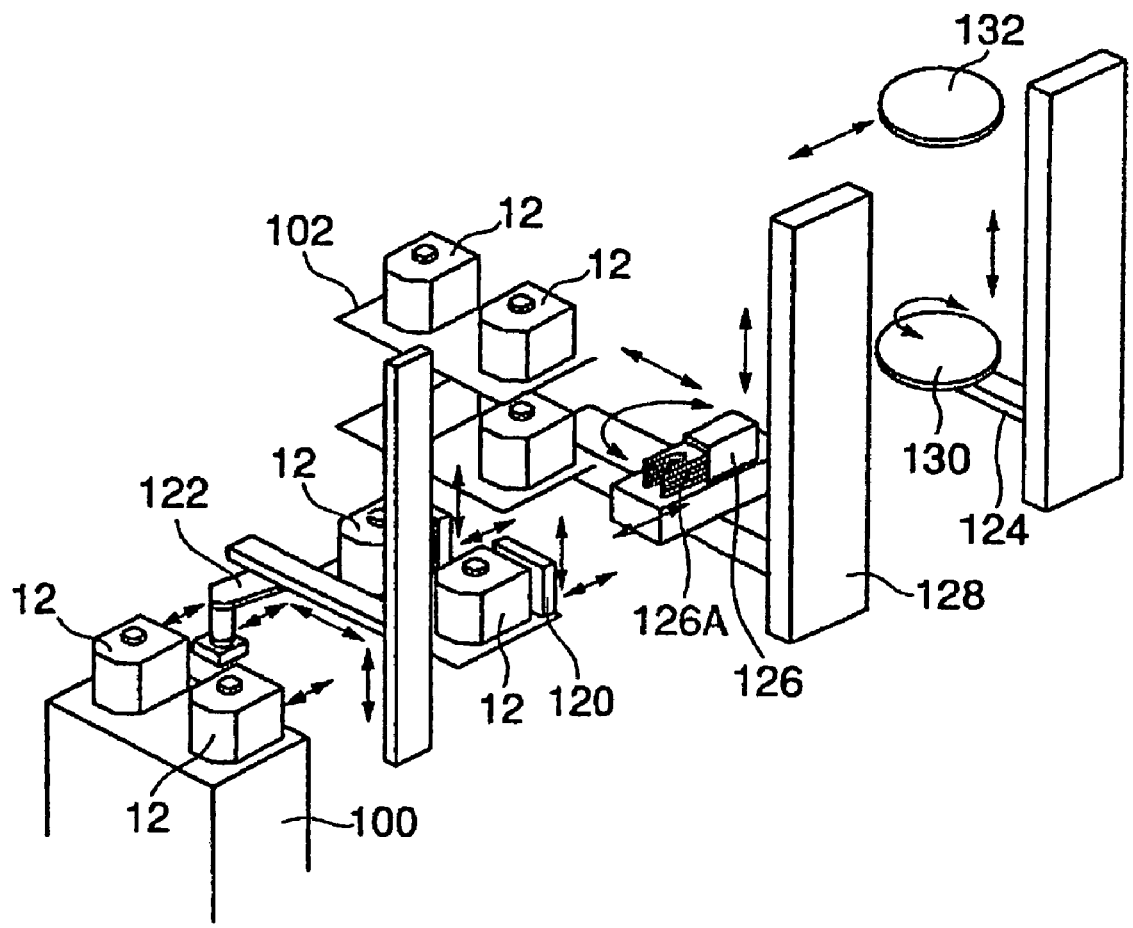
FIG. 13 is a perspective view showing a main part of the processing system.
Figure 15:
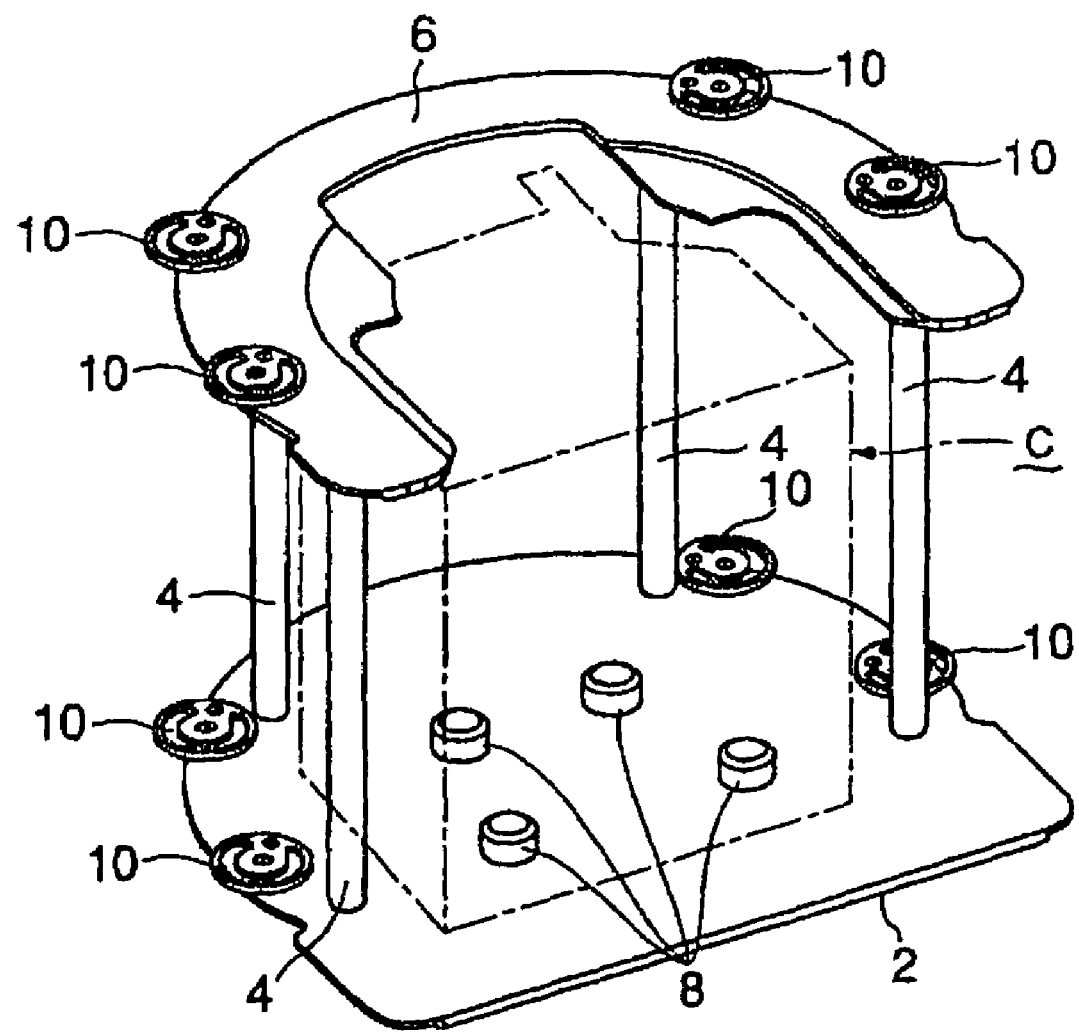
FIG. 15 is a perspective view showing an example of conventional assistant jig used for a containing case body.

FIG. 12 is a schematic structural view showing an example of processing system of the present embodiment. FIG. 13 is a perspective view showing a main part of the processing system. FIG. 14 is a view showing an example of object-to-be-processed conveying mechanism used in the processing system.

As shown in FIGS. 12 and 13, the whole processing system 90 for the object to be processed is surrounded by a housing 92 made of stainless steel or the like. The inside of the housing 92 is divided by a division wall 98 into a case-body conveying area 94, in which the containing case body 12 or 80 can be conveyed, and a wafer conveying area 96 as an object-to-be-processed conveying area, in which the semiconductor wafers W1 or W2 as objects to be processed can be conveyed. A clean air flows downward in the case-body conveying area 94. The wafer conveying area 96 is filled with an inert-gas atmosphere such as an $N_2$ gas or a clean-air atmosphere. The processing system 90 mainly consists of: a load port 100 through which the containing case body 12 or 80 can be conveyed into or out from the system 90; a stocker 102 for temporarily storing the containing case body 12 or 80; a conveyance stage 106 at which the semiconductor wafers W1 or W2 are conveyed between the containing case body 12 or 80 and an object-to-be-processed boat 104; a processing container 108 for conducting a predetermined thermal process to the semiconductor wafers W held by the object-to-be-processed boat 104; and a lid opening-closing mechanism 110 provided on a side of the wafer conveying area with respect to the conveyance stage 106.

At the load port 100, a box conveyance port 112 is formed in the housing 92, and is always open. Outside the box conveyance port 112, an outside stage 114 for placing the containing case body 12 or 80 conveyed from the outside is provided in an inward slidable manner.

On the other hand, in the stocker 102, for example two-row and two-step shelves or the like may be provided for temporarily placing and stocking the containing case body 12 or 80. In addition, at the conveyance stage 106, one or more openings 116 are formed in the division wall 98 dividing the both areas 94 and 96, the size of each opening 116 being substantially the same as the opening part of the containing case body 12 or 80. A stage 118 is provided horizontally on a side of the case-body conveying area with respect to the opening 116. The containing case body 12 or 80 placed on the stage 118 may be fixed by pressing toward the division wall 98. In addition, at the opening 116, an open-close door 120 that opens and closes the opening 116 is provided. Between the stage 118 and the load port 100, a case-body conveying mechanism 122 having an elevating function is provided. Thus, the containing case body 12 or 80 can be conveyed freely between the load port 100, the stocker 102, and the stage 106.

Then, just under the opening 116 on the side of the wafer conveying area, the opening-closing mechanism 110 for opening and closing the open-close lid 20 of the containing case body 12 or 80 and the open-close door 120 is provided. As the opening-closing mechanism 110, for example, an opening-closing mechanism disclosed in JP Laid-Open Publication No. 8-279546 and an opening-closing mechanism disclosed in JP Laid-Open Publication No. 11-274267 may be used.

In the wafer conveying area 96, a boat elevating mechanism 124 that moves up and down the object-to-be-processed boat 104 such as a wafer boat is provided. Then, an object-to-be-processed conveying mechanism 126 having an arm 126A that can rotate, extend, and contract is provided between the boat elevating mechanism 124 and the conveyance stage 106. The object-to-be-processed conveying mechanism 126 can be moved up and down by an up-down elevator 128. Thus, by causing the arm 126A of the object-to-be-processed conveying mechanism 126 to rotate, extend and/or contract and by moving up and/or down the object-to-be-processed conveying mechanism 126, the wafers W1 or W2 can be conveyed between the containing case body 12 or 80 on the stage 118 and the object-to-be-processed boat 104.

The object-to-be-processed boat 104 is made of for example quartz, and is configured to support about 1 to 150 wafers at a predetermined pitch in a tier-like manner. Specifically, as the object-to-be-processed boat 104, a boat for lager wafers having a diameter of for example 300 mm and a boat for smaller wafers having a diameter of for example 200 mm are prepared. Then, depending on the size of wafers to be processed, one of the boats is selectively used.

In addition, above one side portion in the wafer conveying area 96, the cylindrical processing container 108 made of quartz is arranged. The processing container 108 is adapted to conduct a predetermined thermal process such as a film-forming process, an oxidation-diffusion process or the like to the many wafers W1 or W2 at a time. Then, the size of the processing container 108 is set to a size capable of containing the larger wafers W1. Under the processing container 108, a cap 130 that can be moved up and down by the boat elevating mechanism 124 is arranged. Above the cap 130, the object-to-be-processed boat 104 is placed. Then, by moving up the cap 130, the object-to-be-processed boat 104 can be loaded into the processing container 108 through a lower opening part of the processing container 108. The lower opening part of the processing container 108 is adapted to be hermetically closed by the cap 130 when the object-to-be-processed boat 104 is loaded.

In addition, at the lower opening part of the processing container 108, a shutter 132 that can slide and close the lower opening part is provided. The number of arms 126A of the object-to-be-processed conveying mechanism 126 is a plural number, for example five or so. At that time, five wafers can be conveyed at a time at the maximum. Herein, FIG. 14 shows an example of an arm 126A. FIG. 14(A) is a plan view of the arm, and FIG. 14(B) is a sectional view of the arm. A tip portion of the arm 126A has two step portions. The broader step portion is formed as a larger step portion 134A for holding the larger wafer W1. The narrower step portion is formed as a smaller step portion 134B for holding the smaller wafer W2.

Thus, the kind of arm 126A can handle both of the larger wafer W1 and the smaller wafer W2. In addition, of course, the arm 126A may be replaced depending on the size of a wafer.

According to the above processing system 90, whichever of the larger wafers W1 or the smaller wafers W2 are contained in the containing case body 12 (only the smaller wafers W2 are contained in the containing case body 80), the open-close lid 120 can be opened and closed by one kind of opening-closing mechanism 110, the wafers W1 or W2 are placed on the object-to-be-processed boat 104 corresponding to each size to undergo the predetermined thermal process in the processing container 108.

The structure of the above processing system 90 is only an example. Of course, this invention is not limited thereto.

In the above, the semiconductor wafer is explained as an object to be processed. However, the object to be processed is not limited to the semiconductor wafer. This invention can be also applied to a glass substrate, a LCD substrate or the like.

The invention claimed is:

1. A containing case body for an object to be processed comprising:
    a box case having a size capable of containing an open type of cassette that can hold a plurality of first objects to be processed and capable of containing a plurality of second objects to be processed, the second objects to be processed being larger than the first objects to be processed,
    a supporting part provided at an inside wall surface of the box case, the supporting part being capable of supporting the second objects to be processed in a tier-like manner,
    an open-close lid provided at an opening part of the box case in a removable and attachable manner, and
    a positioning-engaging part provided at a bottom part of the box case in a removable and attachable manner,
    wherein
    the open-close lid is capable of sealing the box case,
    the positioning-engaging part is capable of engaging with a positioning member provided at a lower surface of a bottom part of the cassette to position the cassette, and
    a position of peripheral edges of the first objects to be processed on a side of the opening part when the cassette that holds the first objects to be processed is contained in the box case and a position of peripheral edges of the second objects to be processed on the side of the opening part when the second objects to be processed are contained in the box case substantially coincide with each other.

2. A containing case body for an object to be processed according to claim 1, wherein
a first pop-out-preventing member is provided on an inside of the open-close lid for preventing that the first objects to be processed pop out from the cassette when the cassette that holds the first objects to be processed is contained in the box case.

3. A containing case body for an object to be processed according to claim 2, wherein
the first pop-out-preventing member is removable from and attachable to the open-close lid.

4. A containing case body for an object to be processed according to claim 1, wherein
a second pop-out-preventing member is provided on an inside of the open-close lid for preventing that the second objects to be processed pop out from the box case when the second objects to be processed are contained in the box case.

5. A containing case body for an object to be processed according to claim 4, wherein
the second pop-out-preventing member is removable from and attachable to the open-close lid.

6. A containing case body for an object to be processed according to claim 1, wherein
a cassette base platform is contained at a bottom part of the box case in a removable and attachable manner, and
the positioning-engaging part is provided on an upper surface of the cassette base platform.

7. A containing case body for an object to be processed comprising:
a box case having a size capable of containing an open type of cassette that can hold a plurality of first objects to be processed and capable of containing a plurality of second objects to be processed, the second objects to be processed being larger than the first objects to be processed,
a supporting part provided at an inside wall surface of the box case, the supporting part being capable of supporting the second objects to be processed in a tier-like manner,
an open-close lid provided at an opening part of the box case in a removable and attachable manner, and
a positioning-engaging part provided at a bottom part of the box case in a removable and attachable manner,
wherein
the open-close lid is capable of sealing the box case,
the positioning-engaging part is capable of engaging with a positioning member provided at a lower surface of a bottom part of the cassette to position the cassette,
a cassette base platform is contained at a bottom part of the box case in a removable and attachable manner,
the positioning-engaging part is provided on an upper surface of the cassette base platform,
a platform fixing jig is provided at a peripheral portion of the cassette base platform,
the platform fixing jig is capable of protruding from and withdrawing into the peripheral portion, and
the cassette base platform is adapted to be fixed in the box case when the platform fixing jig is pressed to an inside wall of the box case.

8. A containing case body for an object to be processed according to claim 7, wherein
the platform fixing jig is provided at each of three peripheral portions of the cassette base platform.

9. A processing system comprising
a containing case body according to claim 1,
a case-body conveying area in which the containing case body can be conveyed,
an object-to-be-processed conveying area that is filled with an inert-gas atmosphere or a clean-gas atmosphere,
a division wall that divides the case-body conveying area and the object-to-be-processed conveying area,
an opening formed at the division wall,
a stage on which the containing case body is placed in such a manner that the opening part of the containing case body faces the opening on a side of the case-body conveying area,
a load port provided in the case-body conveying area, capable of communicating with an outside area,
a stocker provided in the case-body conveying area, by which the containing case body can be temporarily stocked,
a case-body conveying mechanism that conveys the containing case body between the load port, the stocker and the stage,
an opening-closing mechanism that opens and closes the open-close lid of the containing case body when the containing case body is placed on the stage,
an object-to-be-processed boat provided in the object-to-be-processed conveying area, corresponding to a size of an object to be processed contained in the containing case body,
a processing container provided in the object-to-be-processed conveying area, capable of conducting a predetermined thermal process to the object to be processed,
a boat elevating mechanism that moves up and down the object-to-be-processed boat to convey the object-to-be-processed boat into and out from the processing container, and
an object-to-be-processed conveying mechanism that conveys the object to be processed between the object-to-be-processed boat and the containing case body placed on the stage.

* * * * *